United States Patent
Huang et al.

(10) Patent No.: US 7,868,377 B2
(45) Date of Patent: Jan. 11, 2011

(54) LAYOUT AND STRUCTURE OF MEMORY

(75) Inventors: Shin-Bin Huang, Hsinchu County (TW); Ching-Nan Hsiao, Kaohsiung County (TW); Chung-Lin Huang, Tao-Yuan (TW)

(73) Assignee: Nanya Technology Corp., Kueishan, Tao-Yuan Hsien (TW)

( * ) Notice: Subject to any disclaimer, the term of this patent is extended or adjusted under 35 U.S.C. 154(b) by 529 days.

(21) Appl. No.: 11/927,616

(22) Filed: Oct. 29, 2007

(65) Prior Publication Data
US 2009/0032858 A1    Feb. 5, 2009

(30) Foreign Application Priority Data
Aug. 2, 2007    (TW)    ............... 96128395 A

(51) Int. Cl.
*H01L 29/94*    (2006.01)
(52) U.S. Cl. .............. 257/326; 257/314; 257/315; 257/316; 257/330; 257/E29.129; 257/E29.3
(58) Field of Classification Search ......... 257/314–328, 257/330, E29.3, E29.129
See application file for complete search history.

(56) References Cited

U.S. PATENT DOCUMENTS

| 5,936,887 | A | 8/1999 | Choi | |
|---|---|---|---|---|
| 6,995,414 | B2 * | 2/2006 | Yaegashi | ............ 257/296 |
| 7,456,466 | B2 * | 11/2008 | Om et al. | ............ 257/315 |

FOREIGN PATENT DOCUMENTS

CN    1893086 A    1/2007

* cited by examiner

*Primary Examiner*—Cuong Q Nguyen
*Assistant Examiner*—Trang Q Tran
(74) *Attorney, Agent, or Firm*—Winston Hsu; Scott Margo

(57) ABSTRACT

A flash memory is provided. The flash memory features of having the select gate transistors to include two different channel structures, which are a recessed channel structure and a horizontal channel. Because of the design of the recessed channel structure, the space between the gate conductor lines, which are for interconnecting the select gates of the select gate transistors arranged on the same column, can be shortened. Therefore, the integration of the flash memory can be increased; and the process window of the STI process can be increased as well. In addition, at least one depletion-mode select gate transistor is at one side of the memory cell string. The select gate transistor of the depletion-mode is always turned on.

15 Claims, 8 Drawing Sheets

US 7,868,377 B2

LAYOUT AND STRUCTURE OF MEMORY

BACKGROUND OF THE INVENTION

1. Field of the Invention

The present invention relates to a memory, and more particularly to the layout and the structure of a NAND flash memory.

2. Description of the Prior Art

Recently, as demands for the portable electronic devices are increasing, the market for the flash memory and the electrically erasable programmable read-only memory (EEPROM) is also expanding as well. The aforesaid portable electronic device includes the storage memory for the digital camera, the cell phones, the video game apparatuses, PDAs, telephone answering machines, and the programmable ICs, etc. A flash memory belongs to a non-volatile memory, and has an important characteristic of being able to store data in the memory even though the power is turned off. By changing the threshold voltage of the transistor, the gate can be turned on and off, and the data can be stored in the transistor. Generally speaking, the flash memory can be divided into two types of configurations, namely, a NOR flash memory and a NAND flash memory. The drains of memory cells of a NOR flash memory are connected in parallel for a faster reading speed, which is suitable for code flash memory mainly used for executing program codes. The drains and sources of two neighboring memory cells of a NAND flash memory are serially connected for integrating more memory cells per unit area, which is suitable for a data flash memory mainly used for data storage. Both of the NOR flash memory and the NAND flash memory have a MOS-like memory cell structure, so as to provide advantages of smaller size, higher operation speed, and higher density.

As the electronic device becomes smaller, integration of the flash memory needs to be increased. Therefore, it is an object of the present invention to provide a new layout and structure for the flash memory to increase the integration of the flash memory. The layout design according to the present invention can make the size of the flash memory smaller.

SUMMARY OF THE INVENTION

According to the flash memory disclosed in the present invention, the flash memory comprises a substrate; a first active area positioned in the substrate, wherein the first active area comprises a first memory cell string comprising a plurality of first storage transistors, a first select gate transistor comprising a first gate length, and a second select gate transistor comprising a second gate length, wherein the first select gate transistor further comprises a first horizontal channel, and the second select gate transistor further comprises a first recessed channel, and wherein each of the first storage transistors comprises a third gate length, respectively; and a second active area positioned in the substrate, wherein the second active area comprises a second memory cell string comprising a plurality of second storage transistors, a third select gate transistor comprising a fourth gate length, and a fourth select gate transistor comprising a fifth gate length, wherein the third select gate transistor further comprises a second recessed channel, and the fourth select gate transistor further comprises a second horizontal channel, and wherein each of the second storage transistors comprises a sixth gate length, respectively, wherein the first select gate transistor and the third select gate transistor are arranged in the same column, and the second select gate transistor and the fourth select gate transistor are arranged in the same column.

According to a preferred embodiment of the present invention, the length of the first gate length, the length of the second gate length, the length of the third gate length, the length of the fourth gate length, the length of the fifth gate length, and the length of the sixth gate length are substantially equal.

The select gate transistor of the present invention includes a recessed channel, which can provide a larger process window, and integration of the elements can be increased due to the recessed channel as well.

These and other objectives of the present invention will no doubt become obvious to those of ordinary skill in the art after reading the following detailed description of the preferred embodiment that is illustrated in the various figures and drawings.

DETAILED DESCRIPTION

The structure of the NAND type flash memory disclosed in the present invention features a structure of a plurality of dual gate transistors (dual SG), which is meant to have two ends of the memory cell strings connected to two select gate transistors in series, respectively. In addition, every storage transistor positioned in the memory cell strings is a two-bit storage transistor.

Figure 1:
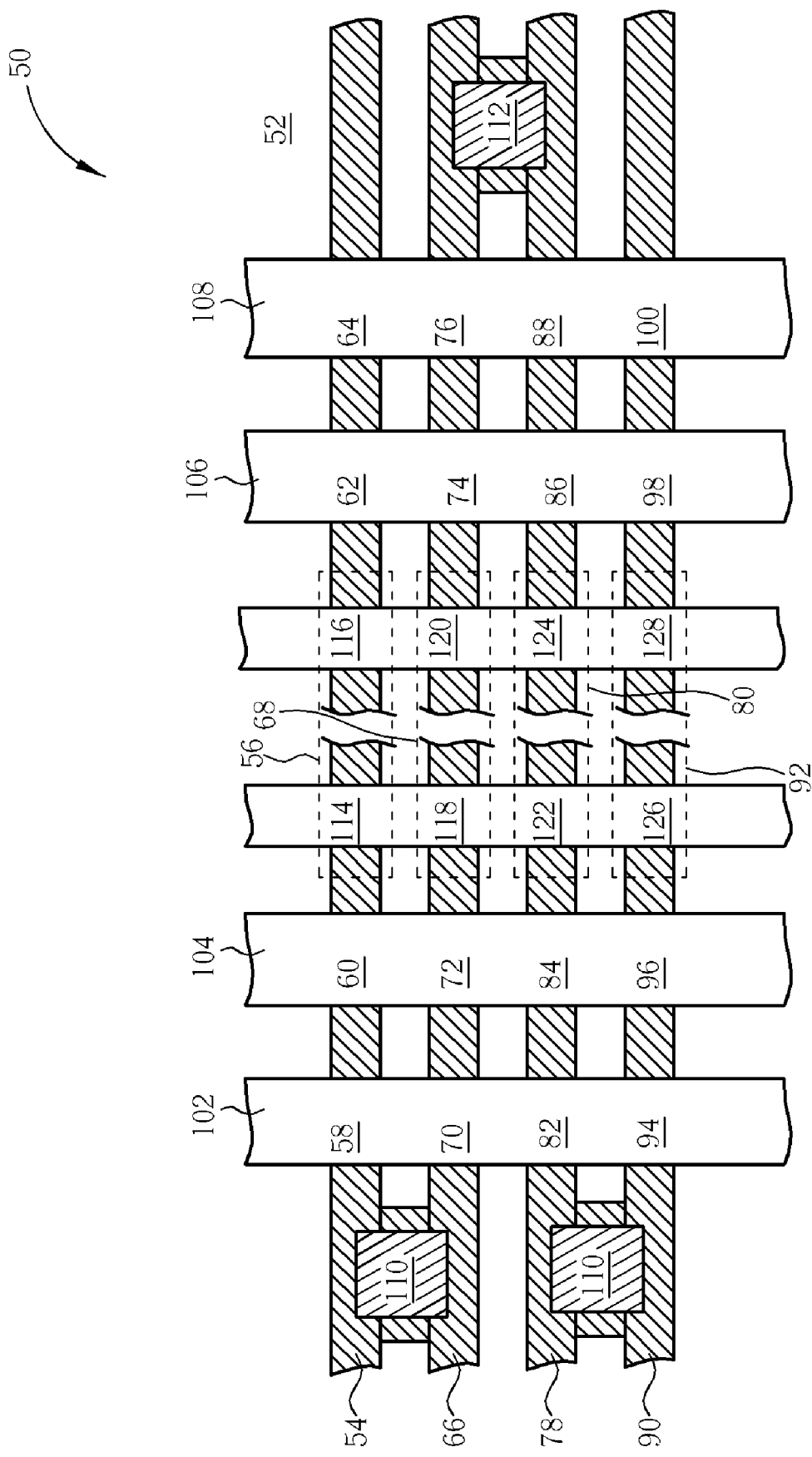
FIG. 1 shows a schematic layout of a NAND type flash memory according to the present invention.

FIG. 1 shows a schematic layout of a NAND type flash memory according to the present invention. As shown in FIG. 1, a NAND type flash memory 50 comprises: a substrate 52, a plurality of active areas 54, 66, 78, 90 positioned in the substrate 52, wherein the active area 54 comprises a plurality of select gate transistors 58, 60, a memory cell string 56, and a plurality of select gate transistors 62, 64, and wherein the select gate transistors 58, 60, the memory cell string 56, and the select gate transistors 62, 64 are positioned in a same row. In addition, the select gate transistor 58 is coupled to the select gate transistor 60 in series, and the select gate transistor 62 is coupled to the select gate transistor 64 in series.

Furthermore, the memory cell string 56 comprises a plurality of two-bit storage transistors, such as the two-bit storage transistors 114, 116; and the two-bit storage transistors 114, 116 comprise a gate length $L_1$. In addition, the select gate transistors 60, 62 comprise a recessed channel (not shown), and the select gate transistors 58, 64 comprise a horizontal channel (not shown). Each of the select gate transistors 58, 60, 62, 64 comprises a gate length $L_2$.

The active area 66 comprises a plurality of select gate transistors 70, 72, a memory cell string 68, and a plurality of select gate transistors 74, 76, and wherein the select gate transistors 70, 72, a memory cell string 68, and the select gate transistors 74, 76 are positioned in a same row. In addition, the select gate transistor 70 is coupled to the select gate transistor 72 in series, and the select gate transistor 74 is coupled to the select gate transistor 76 in series.

Furthermore, the memory cell string 68 comprises a plurality of two-bit storage transistors, such as the two-bit storage transistors 118, 120; and the two-bit storage transistors 118, 120 comprise a gate length $L_1$. In addition, the select gate transistors 70, 76 comprise a recessed channel (not shown), and the select gate transistors 72, 74 comprise a horizontal channel (not shown). Each of the select gate transistors 70, 72, 74, 76 comprises a gate length $L_2$.

The active area 78 comprises a plurality of select gate transistors 82, 84, a memory cell string 80, and a plurality of select gate transistors 86, 88, and wherein the select gate transistors 82, 84, a memory cell string 80, and the select gate transistors 86, 88 are arranged in a same row. In addition, the select gate transistor 82 is coupled to the select gate transistor 84 in series, and the select gate transistor 86 is coupled to the select gate transistor 88 in series. Furthermore, the memory cell string 80 comprises a plurality of two-bit storage transistors, such as the two-bit storage transistors 122, 124; and the two-bit storage transistors 122, 124 comprise a gate length $L_1$. In addition, the select gate transistors 84, 86 comprise a recessed channel (not shown), and the select gate transistors 82, 88 comprise a horizontal channel (not shown). Each of the select gate transistors 82, 84, 86, 88 comprises a gate length $L_2$.

Furthermore, the active area 90 comprises a plurality of select gate transistors 94, 96, a memory cell string 92, and a plurality of select gate transistors 98, 100, and wherein the select gate transistors 94, 96, the memory cell string 92, and the select gate transistors 98, 100 are arranged in a same row. In addition, the select gate transistor 94 is coupled to the select gate transistor 96 in series, and the select gate transistor 98 is coupled to the select gate transistor 100 in series. Furthermore, the memory cell string 92 comprises a plurality of two-bit storage transistors, such as the two-bit storage transistors 126, 128; and the two-bit storage transistors 126, 128 comprise a gate length $L_1$. In addition, the select gate transistors 94, 100 comprise a recessed channel (not shown), and the select gate transistors 96, 98 comprise a horizontal channel (not shown). Each of the select gate transistors 94, 96, 98, 100 comprises a gate length $L_2$.

According to the preferred embodiment of the present invention, the length of the gate length $L_1$ can be equal to the length of the gate length $L_2$, but is not limited to this limitation; the length of the gate length $L_1$ and the length of the gate length $L_2$ can be different as well. In addition, the select gate transistors 58, 64, 72, 74, 82, 88, 96, 98 comprising a horizontal channel is always remained at depletion mode during operation, which means that the select gate transistors 58, 64, 72, 74, 82, 88, 96, 98 are always turned on during operation.

Additionally, the select gate transistors 58, 70, 82, 94 arranged in a same column are coupled to each other in sequence electrically through a gate conductor 102. The select gate transistors 60, 72, 84, 96 positioned in a same column are coupled to each other in sequence electrically through a gate conductor 104. The select gate transistors 62, 74, 88, 98 positioned in a same column are coupled to each other in sequence electrically through a gate conductor 106. The select gate transistors 64, 76, 88, 100 positioned in a same column are coupled to each other in sequence electrically through a gate conductor 108. In addition, a plurality of bit-line contact pads 110, 112 are positioned at a side of the gate conductors 102, 108 respectively to send the bit-line signals.

Because the select gate transistors of the present invention comprise a recessed channel, a larger window process can be obtain during the STI formation, and the integration of the elements can be increased as well. For example, the width of the gate conductor can shrink to 0.09 μm, and the space of the gate conductor can shrink to 0.09 μm. Therefore, the space which the gate conductor has occupied according to the present invention is smaller than the space which the gate conductor occupied according to the conventional process.

Figure 2A:
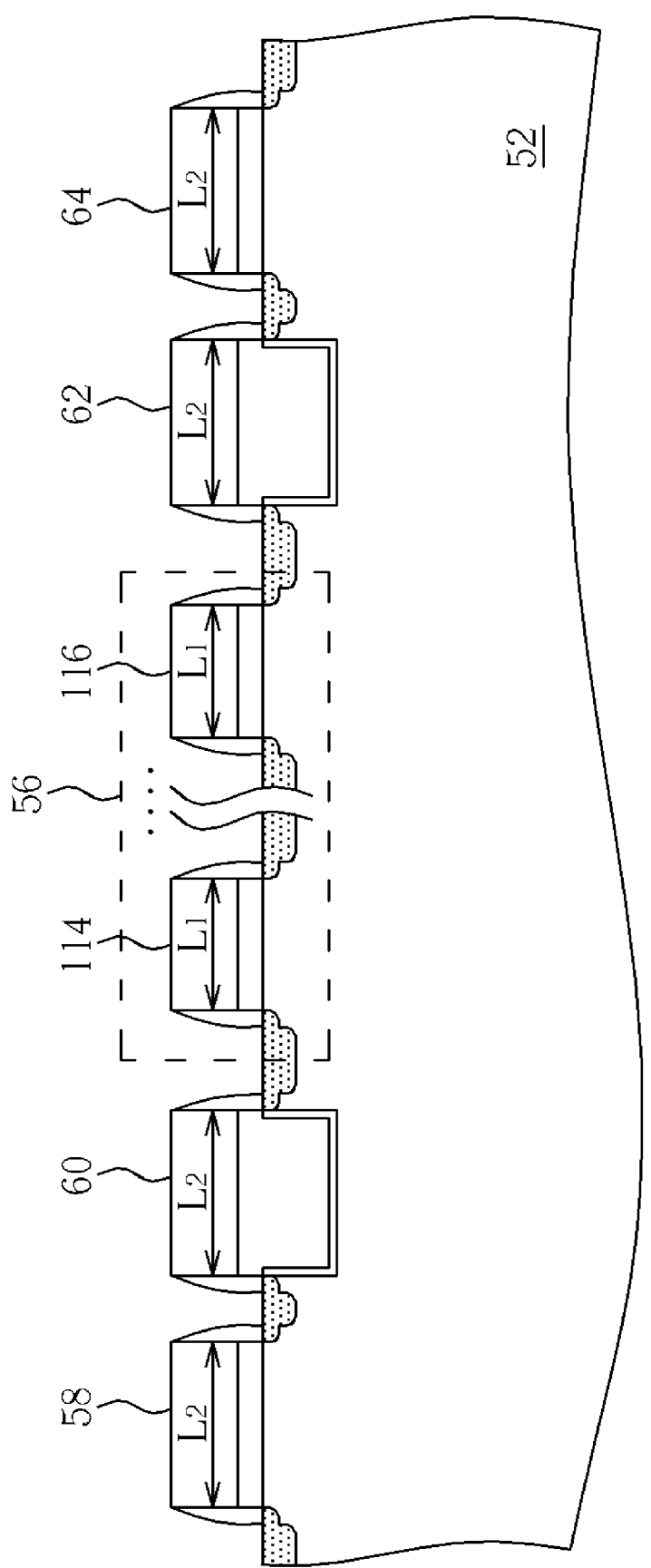
FIG. 2a shows a sectional view as viewed along the active area 54 in FIG. 1 according to the NAND type flash memory of the present invention.

FIG. 2a shows a sectional view as viewed along the active area 54 in FIG. 1 according to the NAND type flash memory of the present invention.

As shown in FIG. 2a, the flash memory 50 comprises a substrate 52, a memory cell string 56 positioned on the substrate 52, a select gate transistor 60 comprising a recessed channel and a gate length $L_2$, a select gate transistor 58 comprising a horizontal channel and a gate length $L_2$, a select gate transistor 62 comprising a recessed channel and a gate length $L_2$, and a select gate transistor 64 comprising a horizontal channel and a gate length $L_2$. In addition, the memory cell string 56 comprises a plurality of two-bit storage transistors, such as the two-bit storage transistors 114, 116 comprising a gate length $L_1$, wherein the number of the two-bit storage transistors comprised in the memory cell string 56 can be 16 or 32, and all of the two-bit storage transistors may be PMOS transistors.

Furthermore, the select gate transistor 60 is connected directly to one end of the memory cell string 56 in series, and the select gate transistor 58 is connected directly to the select gate transistor 60 in series. The select gate transistor 62 is connected directly to another end of the memory cell string 56 in series, and the select gate transistor 64 is connected directly to the select gate transistor 62 in series.

According to a preferred embodiment of the present invention, the select gate transistors 58, 64 comprising a horizontal channel are always in a depletion mode, which means that the select gate transistors 58, 64 are always turned on during operation.

Figure 2B:
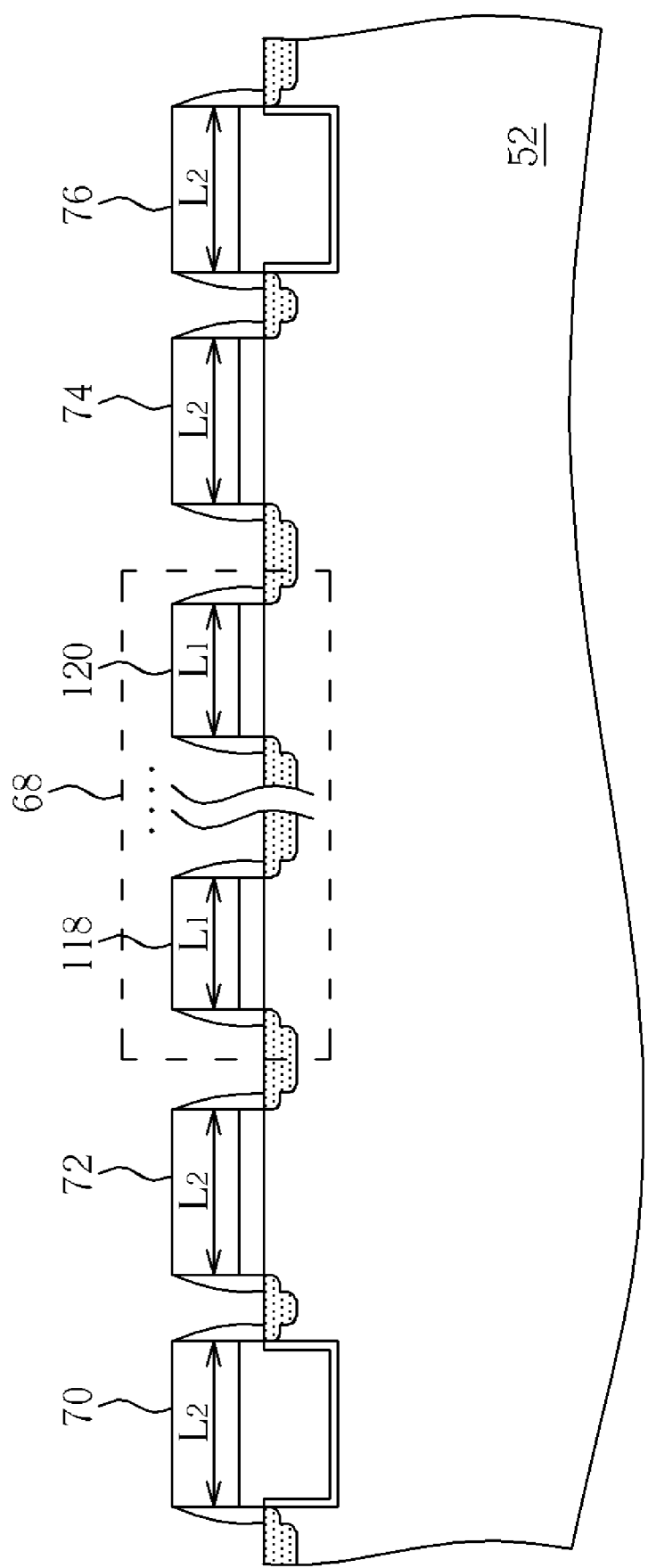
FIG. 2b shows a sectional view as viewed along the active area 68 in FIG. 1 according to the NAND type flash memory of the present invention.

FIG. 2b shows a sectional view as viewed along the active area 66 in FIG. 1 according to the NAND type flash memory of the present invention. As shown in FIG. 2b, the flash memory 50 comprises a substrate 52, a memory cell string 68 positioned on the substrate 52, a select gate transistor 72 comprising a horizontal channel and a gate length $L_2$, a select gate transistor 70 comprising a recessed channel and a gate length $L_2$, a select gate transistor 74 comprising a horizontal channel and a gate length $L_2$, and a select gate transistor 76 comprising a recessed channel and a gate length $L_2$. In addition, the memory cell string 68 comprises a plurality of two-bit storage transistors, such as the two-bit storage transistors 118, 120, which comprise a gate length $L_1$, wherein the number of the two-bit storage transistors comprised in the memory cell string 68 can be 16 or 32, and all of the two-bit storage transistors may be PMOS transistors. Furthermore, the select gate transistor 72 is connected directly to one end of the memory cell string 68 in series, and the select gate transistor 70 is connected directly to the select gate transistor 72 in series. The select gate transistor 74 is connected directly to another end of the memory cell string 68 in series, and the select gate transistor 76 is connected directly to the select gate transistor 74 in series.

According to a preferred embodiment of the present invention, the select gate transistors 72, 74 comprising a horizontal channel are always in a depletion mode, which means that the select gate transistors 72, 74 are always turned on during operation.

Figure 2C:
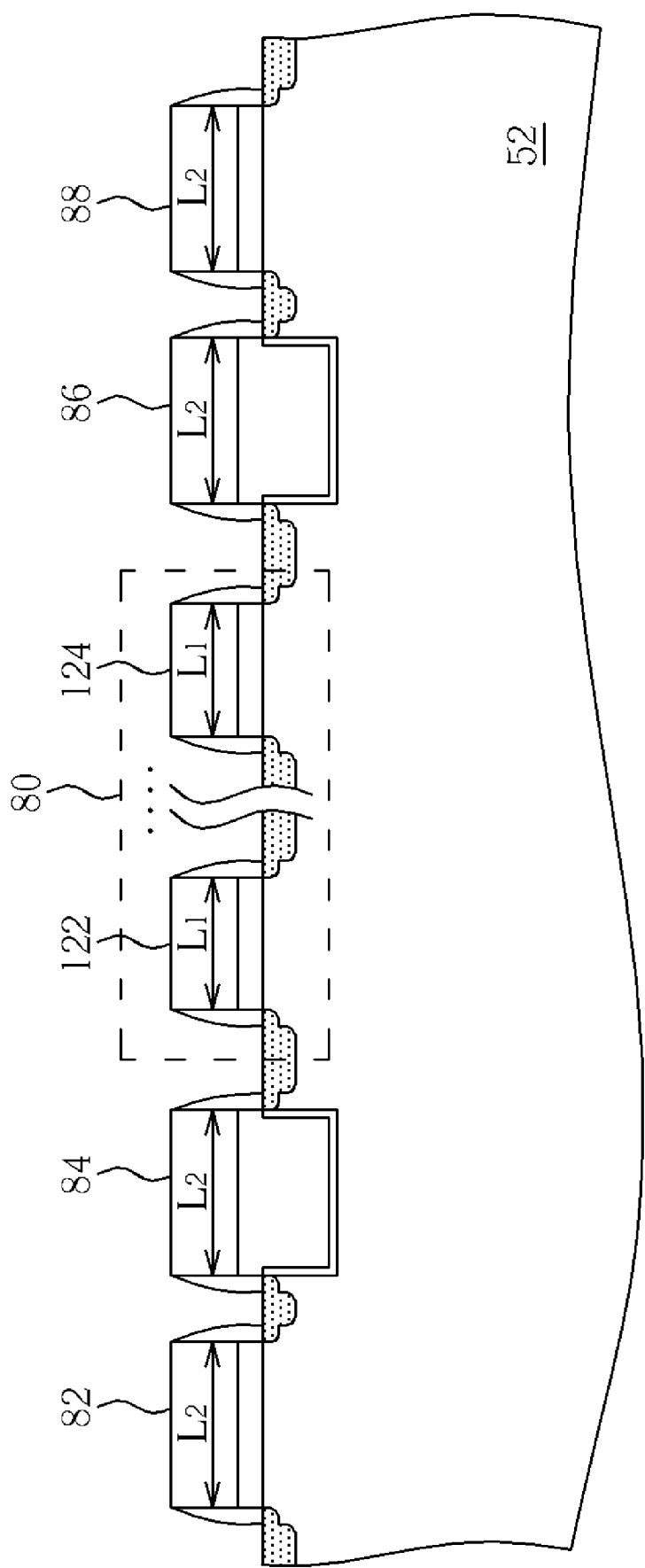
FIG. 2c shows a sectional view as viewed along the active area 80 in FIG. 1 according to the NAND type flash memory of the present invention.

FIG. 2c shows a sectional view as viewed along the active area 78 in FIG. 1 according to the NAND type flash memory of the present invention. As shown in FIG. 2c, the flash memory 50 comprises a substrate 52, a memory cell string 80 positioned on the substrate 52, a select gate transistor 84 comprising a recessed channel and a gate length $L_2$, a select gate transistor 82 comprising a horizontal channel and a gate length $L_2$, a select gate transistor 86 comprising a recessed channel and a gate length $L_2$, and a select gate transistor 88 comprising a horizontal channel and a gate length $L_2$. In addition, the memory cell string 80 comprises a plurality of two-bit storage transistors, such as the two-bit storage transistors 122, 124 comprising a gate length $L_1$, wherein the number of the two-bit storage transistors comprised in the memory cell string 80 can be 16 or 32, and all of the two-bit storage transistors may be PMOS transistors. Furthermore, the select gate transistor 84 is connected directly to one end of the memory cell string 80 in series, and the select gate transistor 82 is connected directly to the select gate transistor 84 in series. The select gate transistor 84 is connected directly to another end of the memory cell string 80 in series, and the select gate transistor 88 is connected directly to the select gate transistor 86 in series.

According to a preferred embodiment of the present invention, the select gate transistors 82, 88 comprising a horizontal channel are always in a depletion mode, which means that the select gate transistors 82, 88 are always turned on during operation.

Figure 2D:
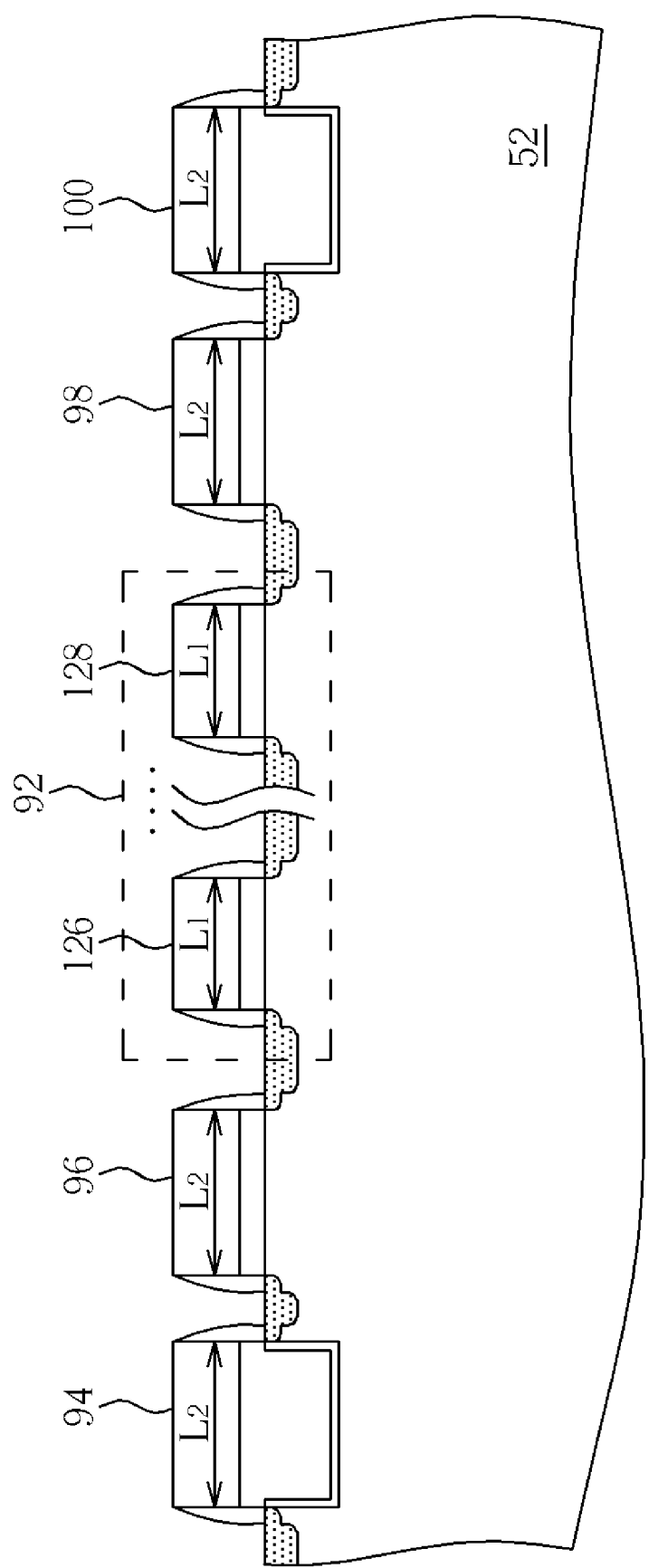
FIG. 2d shows a sectional view as viewed along the active area 92 in FIG. 1 according to the NAND type flash memory of the present invention.

FIG. 2d shows a sectional view as viewed along the active area 92 in FIG. 1 according to the NAND type flash memory of the present invention. As shown in FIG. 2d, the flash memory 50 comprises a substrate 52, a memory cell string 92 positioned on the substrate 52, a select gate transistor 96 comprising a horizontal channel and a gate length $L_2$, a select gate transistor 94 comprising a recessed channel and a gate length $L_2$, a select gate transistor 98 comprising a horizontal channel and a gate length $L_2$, and a select gate transistor 100 comprising a recessed channel and a gate length $L_2$. In addition, the memory cell string 92 comprises a plurality of two-bit storage transistors, such as the two-bit storage transistors 126, 128, which comprise a gate length $L_1$, wherein the number of the two-bit storage transistors comprised in the memory cell string 92 can be 16 or 32, and all of the two-bit storage transistors may be PMOS transistors. Furthermore, the select gate transistor 96 is connected directly to one end of the memory cell string 92 in series, and the select gate transistor 94 is connected directly to the select gate transistor 96 in series. The select gate transistor 98 is connected directly to another end of the memory cell string 92 in series, and the select gate transistor 100 is connected directly to the select gate transistor 98 in series. According to a preferred embodiment of the present invention, the select gate transistors 96, 98 comprising a horizontal channel are always in a depletion mode, which means that the select gate transistors 96, 98 are always turned on during operation.

Figure 3:
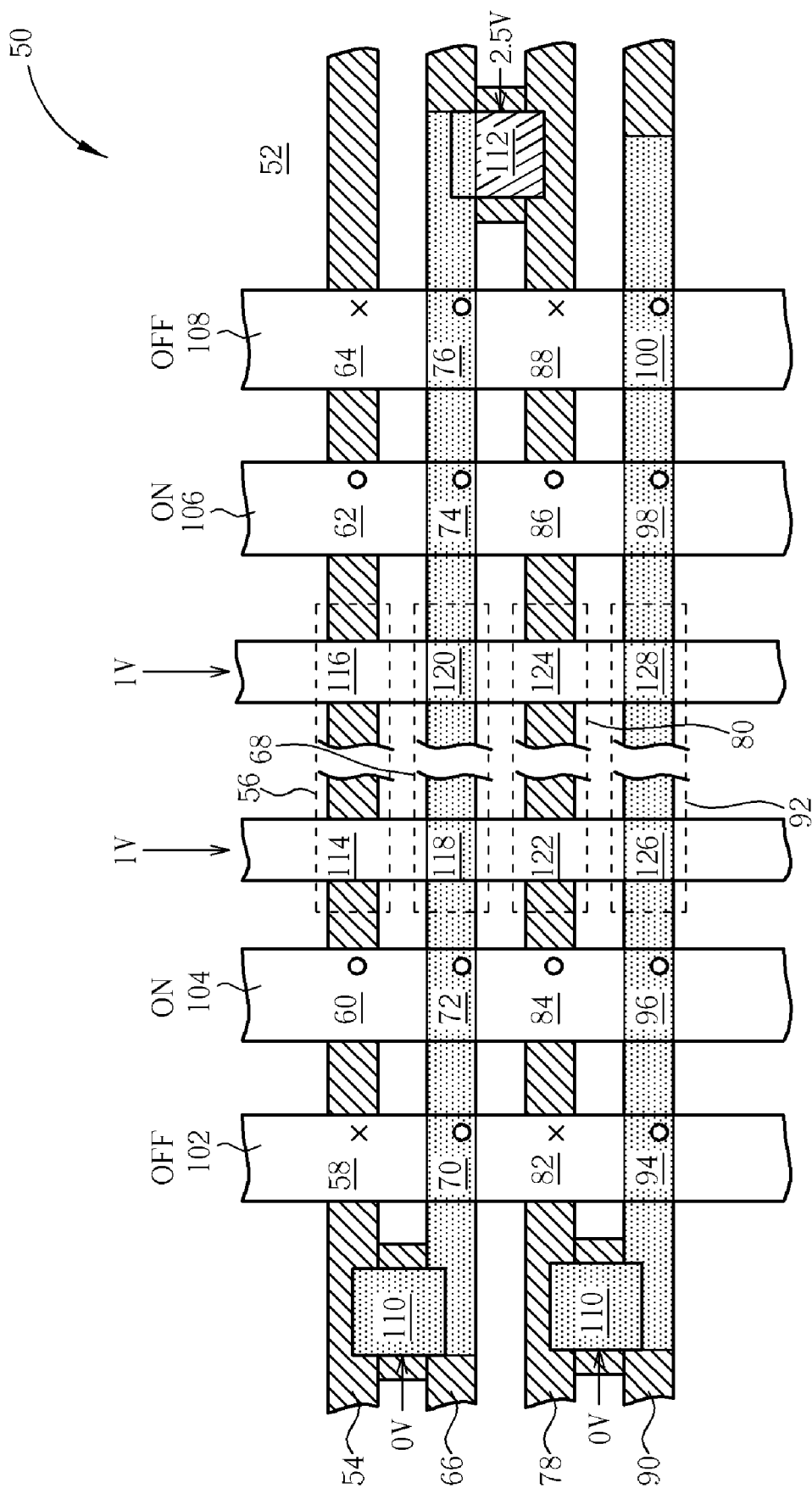
FIG. 3 to FIG. 5 show the operating method of the NAND type flash memory according to the present invention.
Figure 4:
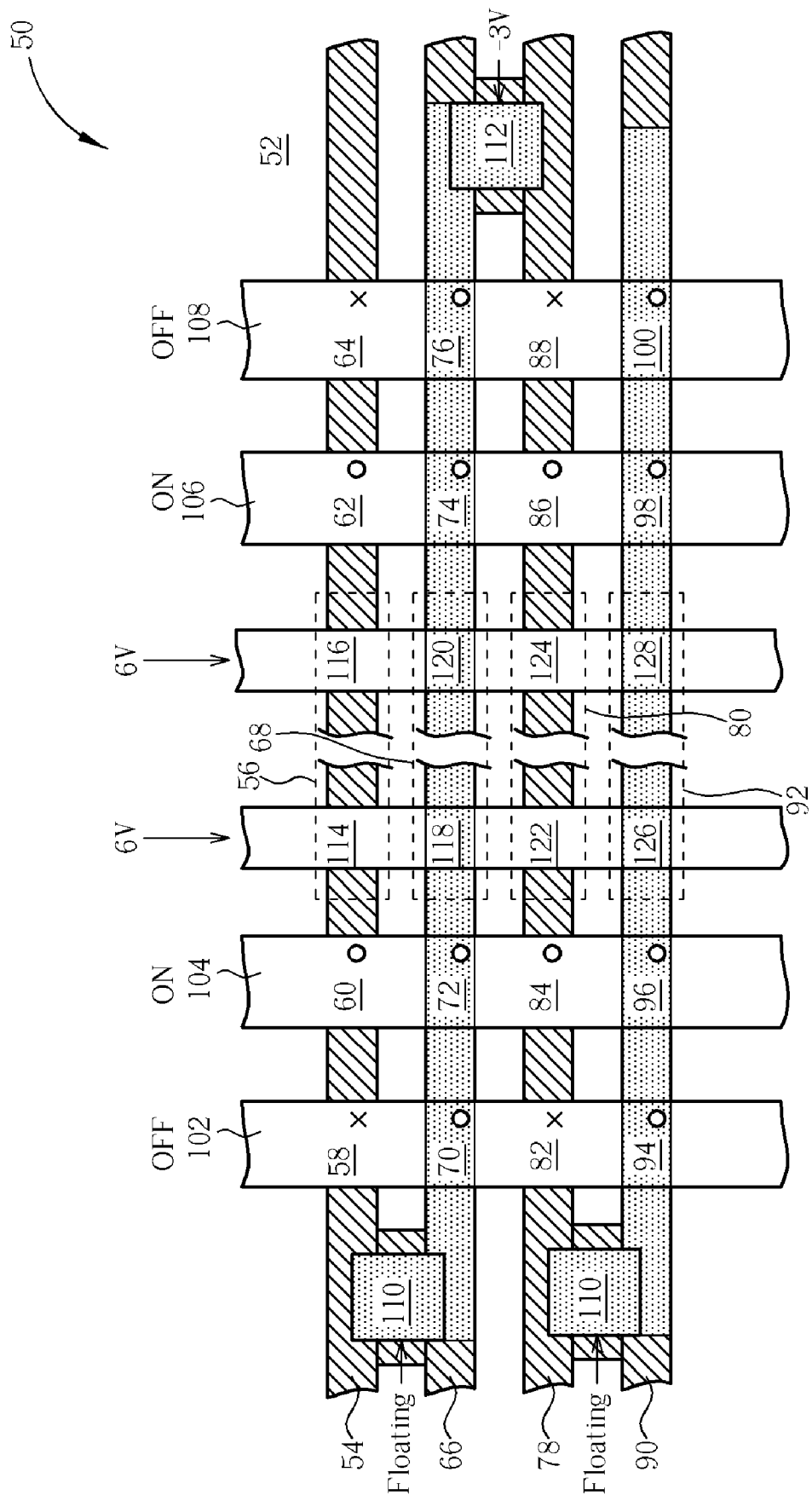
Figure 5:
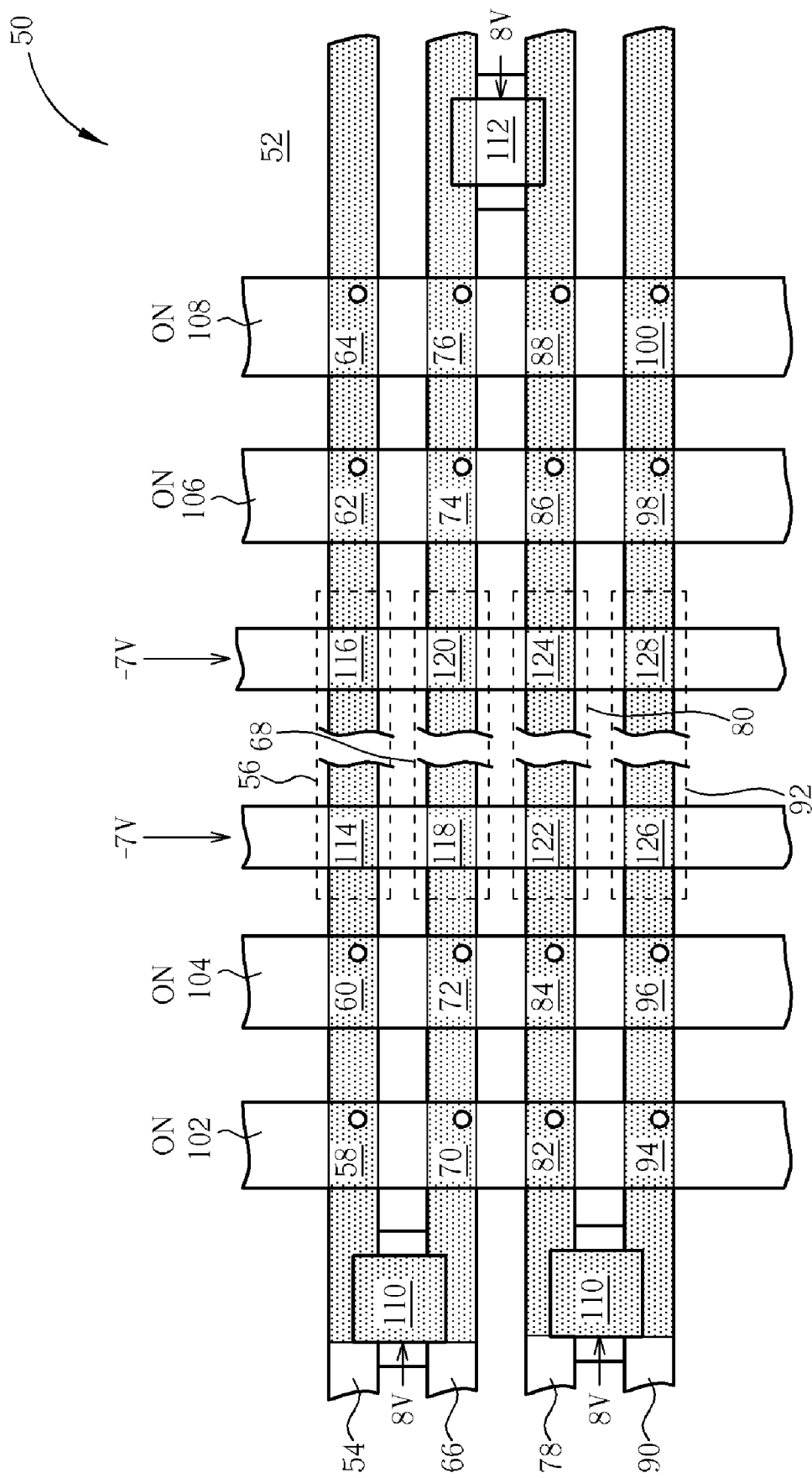

FIG. 3 to FIG. 5 show the operating method of the NAND type flash memory according to the present invention.

FIG. 3 shows the operating method in which the memory cell strings 68, 92 are read simultaneously.

First, the select gate transistor having the symbol "○" depicted on it means that the select gate transistor is turned on, and the select gate transistor having the symbol "X" depicted on it means that the select gate transistor is turned off.

As shown in FIG. 3, the gate conductors 102, 108 are turned off, the gate conductors 104, 106 are turned on, 1 volt is applied to the memory cell strings 56, 68, 80, 92, 0 volt is applied to the bit-line contact pad 110, 2.5 volts is applied to the bit-line contact pad 112, and 0 volt is applied to the substrate 52 (not shown).

Notably, the select gate transistors 58, 64, 72, 74, 82, 88, 96, 98 are always turned on, because they are in the depletion mode. Therefore, the turning on and off of the gate conductors 102, 104, 106, 108 are to only control the on and off of the select gate transistors 76, 84, 86, 94, 100. In this way, the data stored in the memory cell strings 68, 92 can be read.

In FIG. 4 and FIG. 5, the select gate transistor having the symbol "○" depicted on it means that the select gate transistor is turned on, and the select gate transistor having the symbol "X" depicted on it means that the select gate transistor is turned off.

FIG. 4 shows the operating method in which memory cell strings 68, 92 are programmed. As shown in FIG. 4, the gate conductors 102, 108 are turned off, the gate conductors 104, 106 are turned on, 6 volts is applied to memory cell strings 56, 68, 80, 92, −3 volts is applied to the bit-line contact pad 112, 0 volt (not shown) is applied to the substrate 52, and the bit-line contact pad 110 is floating. In this way, data can be programmed into the two-bit storage transistors 114, 116, 126, 128 which are comprised in the memory cell strings 68, 92, respectively.

FIG. 5 shows the operating method in which the memory cell strings 56, 68, 80, 92 are block erased. As shown in FIG. 5, all of the gate conductors 102, 104, 106, 108 are turned on, −7 volts is applied to the memory cell strings 56, 68, 80, 92, 8 volts is applied to the bit-line contact pad 112, 8 volts is applied to the bit-line contact pad 110, and 8 volts (not shown) is applied to the substrate 52. In this way, data stored in the memory cell strings 56, 68, 80, 92 can be block erased.

Those skilled in the art will readily observe that numerous modifications and alterations of the device and method may be made while retaining the teachings of the invention.

What is claimed is:

1. A flash memory, comprising:
   a substrate;
   a memory cell string comprising a plurality of storage transistors positioned on the substrate, wherein each of the storage transistors comprises a first gate length, respectively;
   a first select gate transistor comprising a second gate length, wherein the first select gate transistor is connected to the memory cell string in series; and
   a second select gate transistor comprising a third gate length, wherein the second select gate transistor is connected to the first select gate transistor in series, the first select gate transistor and the second select gate transistor are positioned on a side of the memory cell string, the first select gate transistor comprises a recessed channel, wherein the first select gate transistor directly adjacent to the memory cell string on one side of the first select gate transistor and the second select gate transistor on a opposite side of the first select gate transistor.

2. The flash memory of claim 1, wherein the memory cell string comprises a plurality of two-bit storage transistors.

3. The flash memory of claim 1, wherein the first gate length, the second gate length, and the third gate length are substantially equal.

4. A flash memory, comprising:
   a substrate;
   a first active area positioned in the substrate, wherein the first active area comprises a first memory cell string comprising a plurality of first storage transistors, a first select gate transistor comprising a first gate length, and a second select gate transistor comprising a second gate length, wherein the second select gate transistor further comprises a first horizontal channel, the first select gate transistor further comprises a first recessed channel directly adjacent to the first memory cell string, the first select gate transistor and the second select gate transistor are positioned in a first direction relative to the first memory cell string, and each of the first storage transistors comprises a third gate length, respectively; and a second active area positioned in the substrate, wherein the second active area comprises a second memory cell string comprising a plurality of second storage transistors, a third select gate transistor comprising a fourth gate length, and a fourth select gate transistor comprising a fifth gate length, wherein the third select gate transistor further comprises a second recessed channel directly adjacent to the second memory cell string, the fourth select gate transistor further comprises a second horizontal channel, the third select gate transistor and the fourth select gate transistor are positioned in a second direction relative to the second memory cell string, the first direction is parallel to the second direction and each of the second storage transistors comprises a sixth gate length, respectively, wherein the first select gate transistor and the third select gate transistor are arranged in a first column, the second select gate transistor and the fourth select gate transistor are arranged in a second column.

5. The flash memory of claim 4, wherein the first select gate transistor is adjacent to the third select gate transistor.

6. The flash memory of claim 4, wherein the second select gate transistor is adjacent to the fourth select gate transistor.

7. The flash memory of claim 4, wherein the first memory cell string comprises a plurality of first two-bit storage transistors.

8. The flash memory of claim 4, wherein the second memory cell string comprises a plurality of second two-bit storage transistors.

9. The flash memory of claim 4, wherein the fourth gate length, the fifth gate length, and the sixth gate length are substantially equal.

10. The flash memory of claim 4, wherein the first gate length, the second gate length, and the third gate length are substantially equal.

11. The flash memory of claim 1, wherein the first select gate transistor is disposed between the memory cell string and the second select gate transistor.

12. The flash memory of claim 11, wherein the first nature comprises a recessed channel.

13. The flash memory of claim 11, wherein the second nature comprises a horizontal channel.

14. The flash memory of claim 11, wherein the first nature comprises a horizontal channel.

15. The flash memory of claim 11, wherein the second nature comprises a recessed channel.

* * * * *